United States Patent [19]
Maruyama

[11] Patent Number: 5,399,830
[45] Date of Patent: Mar. 21, 1995

[54] PLASMA TREATMENT APPARATUS

[75] Inventor: Takahiro Maruyama, Hyogo, Japan

[73] Assignee: Mitsubishi Denki Kabushiki Kaisha, Tokyo, Japan

[21] Appl. No.: 180,159

[22] Filed: Jan. 11, 1994

[30] Foreign Application Priority Data

Jan. 25, 1993 [JP] Japan .................. 5-010090

[51] Int. Cl.6 .............. B23K 10/00; H01L 21/00
[52] U.S. Cl. .............. 219/121.43; 219/121.42; 156/345; 204/298.16; 204/298.37; 204/298.38
[58] Field of Search ........... 219/121.43, 121.44, 219/121.42; 156/345, 643, 646; 315/111.21, 111.41; 204/298.16, 298.17, 298.37, 298.38

[56] References Cited

U.S. PATENT DOCUMENTS

| | | | |
|---|---|---|---|
| 4,574,179 | 3/1986 | Masuzawa et al. | 219/121.43 |
| 5,133,825 | 7/1992 | Hakamata et al. | 156/345 |
| 5,168,197 | 12/1992 | Tamba et al. | 315/111.81 |
| 5,279,669 | 1/1994 | Lee | 219/121.43 |
| 5,290,993 | 3/1994 | Kaji et al. | 219/121.43 |

Primary Examiner—Mark H. Paschall
Attorney, Agent, or Firm—Lowe, Price, LeBlanc & Becker

[57] ABSTRACT

An electromagnetic coil and the microwave generating source are provided so that the ECR discharge occurs to the reactive gas within the reaction chamber by generating a magnetic field in the reaction chamber and by introducing the microwave into it, for generating plasma. The sample table for placing the wafer is installed within the reaction chamber, on which wafer treatment like etching is effected by the plasma generated within the reaction chamber. The reaction chamber includes a first portion and a second portion which is insulated from the first portion by an insulating portion. The first portion and the second portion are structured so that the potential difference is applied by way of the power supply.

10 Claims, 15 Drawing Sheets

PLASMA TREATMENT APPARATUS

BACKGROUND OF THE INVENTION

1. Field of the Invention

The present invention relates to a plasma treatment apparatus, and more particularly to a plasma treatment apparatus utilizing the electron cyclotron resonance (referred to as ECR hereinafter) discharge.

2. Description of the Background Art

In manufacturing of a semiconductor device such as an IC (Integrated Circuit), treatment such as formation of thin film and etching are applied on the surface of a semiconductor substrate (wafer). Lately, a plasma treatment apparatus using plasma generated by ECR discharge has been developed and put into practical use as a apparatus for processing such a semiconductor substrate. A structure of a conventional plasma treatment apparatus using plasma generated by ECR discharge will be described below.

FIG. 12 is a sectional view schematically showing a structure of a conventional plasma treatment apparatus. Referring to FIG. 12, a plasma treatment apparatus 310 includes a reaction chamber 101, an electromagnetic coil 103, a microwave generating source 104, a waveguide 105, a microwave introducing window 106, a pipe 107, an exhaust hole 108, and a sample table 109.

One end of waveguide 105 is attached to the upper portion of reaction chamber 101. Waveguide 105 and reaction chamber 101 are separated by microwave introducing window 106. The other end of waveguide 105 is attached to microwave generating source 104.

Electromagnetic coil 103 is provided to surround the periphery of reaction chamber 101. Pipe 107 which supplies a reactive gas is provided at the upper portion of reaction chamber 101. Exhaust hole 108 is provided at the bottom of reaction chamber 101. A pump (not shown) is attached to exhaust hole 108. Sample table 109 is attached inside reaction chamber 101. A wafer 120 can be placed on sample table 109.

A conventional plasma treatment method will be described.

Referring to FIG. 12, a residual gas in reaction chamber 101 is well exhausted from exhaust hole 108. Then a reactive gas is introduced into reaction chamber 101 through pipe 107. While the reactive gas is introduced, a portion of the reactive gas is exhausted through exhaust hole 108, so that gas pressure in reaction chamber 101 will be kept at a predetermined value.

Microwave is then generated from microwave generating source 104. The microwave will be introduced into reaction chamber 101 through waveguide 105 and microwave introducing window 106. Meanwhile, a magnetic field, which gradually attenuates from the upper portion of reaction chamber 101 to wafer 120, will be formed in reaction chamber 101 by rendering electromagnetic coil 103 conductive. Plasma is produced by the electromagnetic field and the microwave. Electrons in the plasma move around a magnetic line of force by the Lorentz's force due to a magnetic field. By adjusting the strength of the magnetic field so that a frequency of the circular motion and the frequency of the microwave will be coincided (that is, adjusting magnetic flux density B such that it satisfies $f = |q| \cdot B / 2\pi m$ for the microwave frequency f), energy of the microwave will be converted effectively into kinetic energy of electrons by resonance absorption. This is referred to as electron cyclotron resonance. Usually, the microwave having the frequency of 2.45 GHz, which is a frequency used in the industry, is often used, while the resonance magnetic field of 875 Gauss is often used.

Electrons in the reactive gas in reaction chamber 101 are accelerated by absorbing the microwave energy and move circularly at a high speed. The electrons making circular motion at a high speed collide with the reactive gas molecule, so that the reactive gas in reaction chamber 101 will be ionized at a high ionization ratio for generating a high density gas plasma. The electrons in the plasma are restricted by the magnetic field and move spirally around a magnetic line of force: its momentum will be changed in the direction of the magnetic line of force by the attenuating field, and they travel to wafer 120.

An electric field, so called an ion sheath electric field, which is perpendicular to the surface of wafer 120, will be generated at the surface of wafer 120 by the travel of the electrons. In the ion sheath electric field, plasma side is made positive and the surface of wafer 120 side is made negative. Reactive ions in the plasma, which are positive ions, are accelerated in the direction to wafer 120 by the ion sheath electric field. The reactive ions are incident upon the surface of wafer 120, and thus, treatment such as etching will be effected on the surface of wafer 120 with these ions.

The conventional plasma treatment apparatus 310 using such ECR discharge has such characteristics that the microwave energy are absorbed effectively in electrons, and that electrons are hard to dissipate in the radial direction of reaction chamber 101 due to the magnetic field. Accordingly, a high density plasma can be produced even in a low gas pressure environment where it is difficult to maintain plasma. Thus, the conventional plasma treatment apparatus 310 using ECR discharge is broadly used currently.

Generally, however, the velocity of the thermal motion of electrons in the plasma produced in reaction chamber 101 is sufficiently higher than that of ions. In other words, mobility of electrons in the plasma is greater than ions. Thus the electrons reach the inner wall of reaction chamber 101 earlier than ions, and vanish. Accordingly, in the center of reaction chamber 101 (a dash-dotted line c—c), relatively large number of ions are left behind, and the plasma potential at ECR plane 130 in the radial direction of reaction chamber 101 will be as shown in FIG. 13, where ECR plane means a plane having a magnetic flux density B which satisfies $f = |q| \cdot B / 2\pi m$ for the microwave frequency f, while q denotes the amount of electron charge, and m denotes electron mass.

Referring to FIG. 13, abscissa denotes a position of reaction chamber 101 in radial direction, and ordinate denotes plasma potential. The plasma potential becomes higher positive potential toward the direction of the arrow. The plasma potential indicates the highest positive potential in the center of reaction chamber 101 because relatively large number of ions having positive charges are left behind, and the potential becomes lower toward the inner wall of reaction chamber 101. Meanwhile, an ion sheath region is formed in the vicinity of the inner wall of reaction chamber 101 since the electromobility of electrons is greater than ions, thus the plasma potential in this region drops abruptly. The plasma potential at ECR plane 130 is thus become non-uniform. The above plasma potential being non-uniform in the radial direction of reaction chamber 101 is described in Howe: J.A.P. 24 (1953) 892.

According to the Boltzman relationship, a distribution of electron density $n_e$ in the radial direction of reaction chamber 101 is represented as:

$$n_e(x) = n_e(0) \exp(e\phi(x)/k_B T_e)$$

where x: distance from the center of reaction chamber, $n_e(x)$: electron density at point x, $\phi(x)$: a potential at point x ($\phi(0)=0$), $k_B$: Boltzman constant, $T_e$: electron temperature, and e: charge of one electron.

According to energy conservation equation and its subsequent equation, a distribution of ion density $n_i$ in the radial direction of reaction chamber 101 is represented as:

$$n_i(X) = n_i(0) \left( 1 - \frac{2e\phi(X)}{Mv(0)} \right)^{-\frac{1}{2}}$$

where M: ion mass and v: average velocity of ions.

Accordingly, when the distribution of plasma potential in the radial direction of reaction chamber 101 is such as shown in FIG. 13, both the distribution of electron density ($n_e$) and the distribution of ion density ($n_i$) are decreased from the center to the inner wall of reaction chamber 101 as shown in FIG. 14.

In conventional plasma treatment apparatus 310 utilizing ECR discharge shown in FIG. 12, the distributions of plasma potential, electron density and ion density in the radial direction of reaction chamber 101 are not uniform. Thus, conventional plasma treatment apparatus 310 has the following disadvantages.

FIG. 15A is a schematic diagram showing magnetic lines of force developed within the reaction chamber. FIGS. 15B and 15C are schematic diagrams respectively showing electrons at P2 and Q2 in FIG. 15A. Referring to FIG. 15A, a magnetic line of force 140 which diverges from the upper portion of reaction chamber 101 to wafer 120 is formed in reaction chamber 101 by rendering an electromagnetic coil conductive (not shown). Electrons in plasma in reaction chamber 101 travel along magnetic line of force 140 from the upper portion of reaction chamber 101 to wafer 120. The electron density in the ECR plane in reaction chamber 101 is high in the center of reaction chamber 101, while it is low at the periphery. Thus, in the ECR plane there are more electrons in the center of the reaction chamber 101 than at the periphery. Thus, there are more electrons which travel along magnetic line of force 140p formed in the center of reaction chamber 101 than those which travel along magnetic line of force 140q formed at the periphery. In other words, as shown in FIGS. 15B and 15C, the number of electrons traveling along magnetic line of force 140p at $P_2$ is greater than the number of electrons traveling along magnetic line of force 140q at $Q_2$.

Thus, the number of electrons traveling along magnetic line of force 140 in the center of reaction chamber 101 is not equal to that at the periphery. Also, there are more electrons incident on unit area on the surface of wafer 120 (i.e. the electron current density) in the center of wafer 120 than at the periphery.

Particularly when a film to be etched on wafer 120 is not conductive, the surface of wafer 120 will be charged not uniformly because of the non-uniformity of the number of electrons which are incident on the surface of wafer 120.

FIG. 16 is a schematic sectional diagram of the wafer showing the surface of the wafer being charged up not uniformly. Referring to FIG. 16, wafer 120 includes a substrate 121, a film to be etched 122 which is deposited on the surface of substrate 121, and a resist pattern 123. Resist pattern 123 is patterned to have a desired form, and thus an exposed surface 122a in the center (a dash-dotted line c—c) of the reaction chamber and an exposed surface 122b at the periphery are exposed respectively from resist pattern 123. As described above, there are more electrons incident at exposed surface 122a than at exposed surface 122b, since the electron current density becomes heavier toward the center of wafer 120. Thus, exposed surface 122a will be charged up deeply negative than the exposed surface 122b.

Generally, ions 182 in the plasma will be incident on the surface of wafer 120 until the surface of wafer 120 is in electrically steady state, in other words, the electron current density and the ion current density become equal. Accordingly, the number of ions 182 which are incident at exposed surface 122a is greater than ions 182 which are incident at exposed surface 122b. Etching rate will be higher at exposed surface 122a than at exposed surface 122b. As a result, the amount of etching is relatively large at exposed surface 122a in the center of wafer 120 (a dash-dotted line c—c), while the amount of etching is relatively small at exposed surface 122b at the periphery as shown in FIG. 17. Thus, when the distribution of electron density becomes non-uniform, a film to be etched in the wafer may not possibly be etched uniformly.

Also, if the area of exposed surface 122a or the like is large, the amount of etching at the center (line c—c) is large and the amount of etching is small in the periphery even within one exposed surface 122a as shown in FIG. 18, possibly causing non-uniform etching.

Non-uniformity of etching might occur also when the film to be etched is conductive. FIG. 19 is a schematic sectional diagram of the wafer showing that non-uniformity of etching occurs when the film to be etched is conductive. Referring to FIG. 19, wafer 120 includes a substrate 124, an insulating film 125 which is formed at the surface of substrate 124, a conductive film 126, and a resist pattern 127 which is formed at the surface of conductive film 126. Resist pattern 127 is patterned to have a desired form and conductive film 126 will be etched using resist pattern 127 as a mask. During etching, the electron current density is higher in the center of the reaction chamber (a dash-dotted line c—c) than at its periphery. However, when the film to be etched is conductive, such as in the case of polycrystalline silicon, electrons will move in the conductive film 126. Conductive film 126 is thus charged up negatively on the entire surface of 120 uniformly. Accordingly, the number of ions incident on each exposed surface of conductive film 126 will be equal, resulting in uniform amount of etching.

However, if the conductive film 126 is overetched, underlying insulating film 125 formed of silicon oxide film or the like will be exposed. As insulating film 125 is not conductive, non-uniformity of etching might occur as described above in which the amount of etching is large at exposed surface 125a in the center of the reaction chamber (a dash-dotted line c—c) while the amount of etching of exposed surface 125b as the periphery is small.

As described above, etching on the surface of the wafer might be non-uniform when the electron density in the ECR plane becomes non-uniform.

Further, when the distribution of the electron density in the ECR plane is non-uniform, local deviation of the distribution of the electron density will occur as shown at B of the FIG. 20, which is so called drift unstability. This is described, e.g. in Motohiko Tanaka and Takaharu Nishikawa, "Physics of High Temperature Plasma" (Maruzen). When the drift unstability occurs, random movement of ions will be enhanced because ions in the plasma move along the local deviation of the electron density.

FIG. 21 shows behavior of ions in the reaction chamber when drift unstability occurs. Referring to FIG. 21, when the random movement of ions 182 is enhanced, the number of ions proceeding into an ion sheath region 150 with a small approach angle $\theta$ is increased. The travel direction of ions within ion sheath region 150 is determined by the sum of vectors of ions at the time of approaching into ion sheath region 150 and vectors of the ion sheath electric field E. Thus, when the approach angle $\theta$ is small, ions are hardly incident vertically on the surface of wafer 120.

FIG. 22 is an enlarged partial sectional view of the wafer schematically showing ions incident on the wafer. Referring to FIG. 22, wafer 120 includes a film to be etched 128 and a resist pattern 129 which is formed on film to be etched 128. Resist pattern 129 is patterned to have a desired form, and underlying film to be etched 128 will be etched using resist pattern 129 as a mask. During the etching, if an ion 182 is not incident vertically on the surface of wafer 120, then ion 182 will collide against the sidewall of a groove 128a. The sidewall of groove 128a will be etched and removed as shown by a dotted-line 128b accordingly, so that highly anisotropic etching will be difficult.

As described above, there was a problem where the anisotropic property of etching might be impaired because of unstability of drift due to a non-uniformity of the electron density.

Generally, most ions move along the flow of electrons traveling along the magnetic line of force. If the ion density in the ECR plane is not uniform as shown in FIG. 14, then the number of ions incident on wafer 120 is considered not to uniform, either. Referring to FIG. 12, the number of ions incident at the center of wafer 120 will be greater than the number of ions incident on the periphery of wafer 120, because the ion density in the center of reaction chamber 101 (a dash-dotted line c—c) is relatively large, while that is relatively small at the periphery of reaction chamber 101. Thus, the etching of wafer 120 will not be carried out uniformly.

As described above, there was a problem of non-uniform etching when the ion density in the ECR plane becomes not uniform.

When the distribution of the plasma potential becomes non-uniform as shown in FIG. 13, anisotropic property of the etching might be impaired, which will be described in detail below.

FIG. 23A is a schematic sectional view of the reaction chamber showing the reduction of anisotropic property of the etching when the distribution of the plasma potential is not uniform. FIG. 23B shows the distribution of the plasma potential in the plane indicated by a dotted-line 131 in FIG. 23A. Mainly referring to FIG. 23A, in the conventional plasma treatment apparatus, the plasma potential in the radial direction of reaction chamber 101 becomes non-uniform in general, due to the difference in mobility of electrons as well as ions. In other words, the plasma potential becomes non-uniform also in 131 plane 131 of the radial direction in addition to ECR plane 130. Ions in the plasma have positive charges, so that they tend to move to where the plasma potential is low. Thus, ion 182 which travels from the upper portion of reaction chamber 101 to wafer 120 will move from the center of reaction chamber 101 to the periphery. As a result, the approach angle $\theta$ of ion 182 which proceeds into ion sheath region 150 is reduced, so that its anisotropic property might be decreased as described above.

As described above, non-uniformity of the plasma potential might decrease the anisotropic property of etching.

SUMMARY OF THE INVENTION

An object of the present invention is to apply a good plasma treatment over a semiconductor substrate such as a wafer, a surface layer thereof and the like.

Another object of the present invention is to improve etching uniformity on a semiconductor substrate such as a wafer, a surface layer thereof and the like.

Still another object of the present invention is to improve anisotropic property of etching over a semiconductor substrate such as a wafer, a surface layer thereof and the like.

A further object of the present invention is to improve anisotropy and uniformity of etching on a semiconductor substrate such as a wafer, a surface layer thereof and the like by eliminating non-uniformity of distribution of plasma potential, electron density, and ion density in a reaction chamber.

In order to accomplish above objects, a plasma treatment apparatus according to one aspect of the present invention performs a prescribed treatment at a main surface of a substrate by generating plasma through electron cyclotron resonance discharge above the main surface of the substrate which is placed in a reaction chamber, and is provided with a peripheral wall portion which surrounds the plasma, which portion includes a first peripheral wall portion disposed such that it can apply a first voltage and a second peripheral wall portion which is insulated from the first peripheral wall portion and disposed such that it can apply the second voltage different from the first voltage; and the apparatus is provided with power supply for applying the first and the second voltages to the first and the second peripheral wall portions, respectively.

The plasma treatment apparatus is structured such that different potentials are applied respectively to the first and the second peripheral wall portions by the power supply. Accordingly, it becomes possible to control the movement of electrons and ions near the first and the second peripheral wall portions in a reaction chamber by applying a potential difference to the first and the second peripheral wall portions. Therefore, for example, the electron density near the peripheral wall portion in the distribution of electron density in the radial direction of the reaction chamber can be increased, and thus non-uniformity in the distribution of the electron density in the radial direction of the reaction chamber can be avoided. Therefore, the distribution of the electron density or the ion density can be made uniform, and accordingly the distribution of the plasma potential can be made uniform. Thus, etching can be accomplished uniformly and with a high anisotropic property.

DESCRIPTION OF THE PREFERRED EMBODIMENTS

A plasma treatment apparatus according to the present invention will be described with reference to the accompanying drawings.

A structure of a plasma treatment apparatus according to a first embodiment of the present invention will be described.

Figure 1:
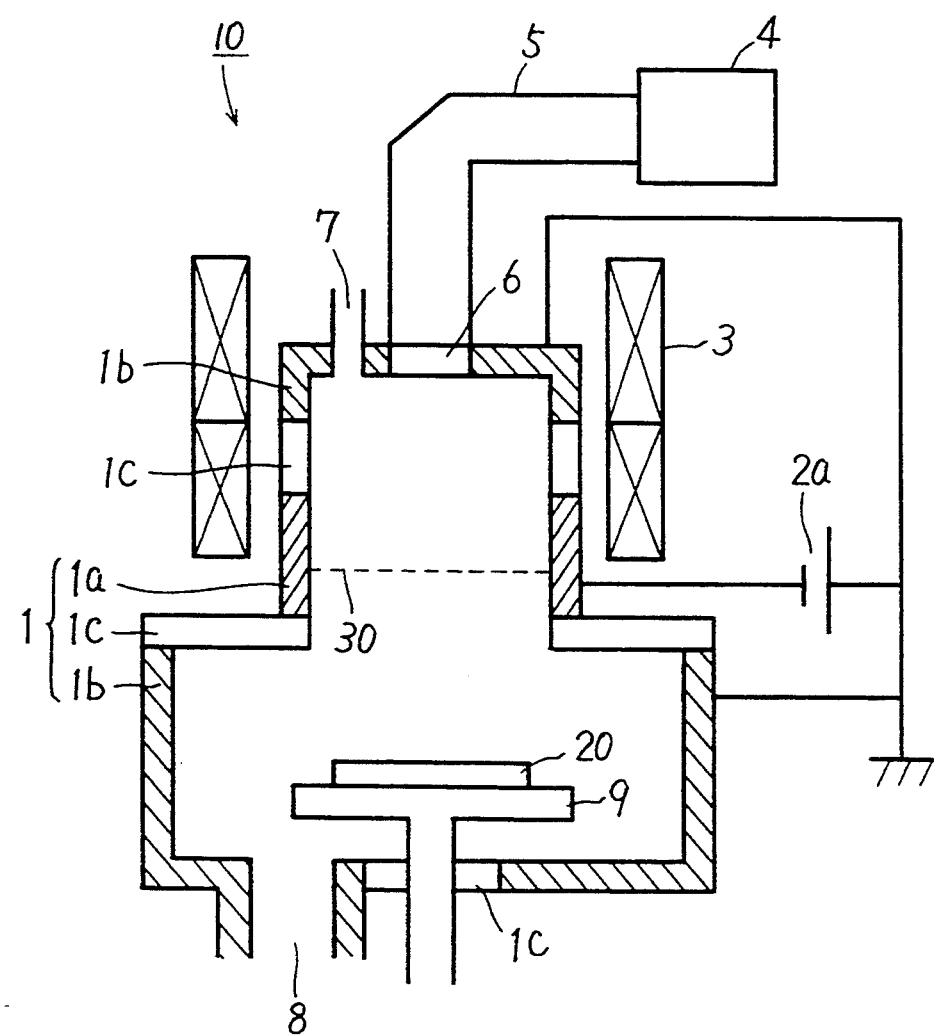
FIG. 1 is a sectional view schematically showing a structure of a plasma treatment apparatus according to a first embodiment of the present invention.

Referring to FIG. 1, a plasma treatment apparatus 10 includes a reaction chamber 1, power supply 2a, an electromagnetic coil 3, a microwave generating source 4, a waveguide 5, a microwave introducing window 6, a pipe 7, an exhaust hole 8 and a sample table 9.

One end of waveguide 5 is attached to the upper portion of reaction chamber 1. Waveguide 5 and reaction chamber 1 are separated by microwave introducing window 6. The other end of waveguide 5 is attached to microwave generating source 4. Electromagnetic coil 3 is provided in the periphery so as to surround reaction chamber 1. Pipe 7 which supplies a reactive gas is provided at the upper portion of reaction chamber 1. Exhaust hole 8 is provided on the bottom of reaction chamber 1. Sample table 9 is attached to the interior of reaction chamber 1 so that a wafer 20 can be placed.

Reaction chamber 1 includes a first conductive portion 1a, a second conductive portion 1b, and an electrically insulating portion 1c. First portion 1a is provided in the vicinity of the ECR plane 30, and negative voltage can be applied thereto by way of power supply 2a. Other than first portion 1a, reaction chamber 1 includes second portion 1b which is insulated from first portion 1a by insulating portion 1c. Second portion 1b is connected to the ground. Thus, first portion 1a as well as second portion 1b are structured such that a predetermined potential difference is provided from power supply 2a.

An operation of the plasma treatment apparatus according to the first embodiment of the present invention will be described below.

Referring to FIG. 1, a residual gas within reaction chamber 1 is sufficiently exhausted from exhaust hole 8. Then, a reactive gas is introduced into reaction chamber 1 through pipe 7. While the reactive gas is introduced, a portion of the reactive gas is exhausted from exhaust hole 8, thus keeping gas pressure within reaction chamber 1 at a predetermined value.

Thereafter a microwave is generated from microwave generating source 4. The microwave is introduced into reaction chamber 1 through waveguide 5 and microwave introducing window 6. By rendering conductive electromagnetic coil 3, a magnetic field which gradually attenuates from the upper portion of reaction chamber 1 to wafer 20 is formed in reaction chamber 1. When the microwave and the magnetic field satisfy the above mentioned condition of cyclotron resonance, ECR discharge will occur in the reactive gas in reaction chamber 1. Negative potential, for example, about −10∼−100 V will be applied to first portion 1a in reaction chamber 1 by way of power supply 2a, and thus the potential difference is provided between first conductive portion 1a and second conductive portion 1b.

Figure 2:
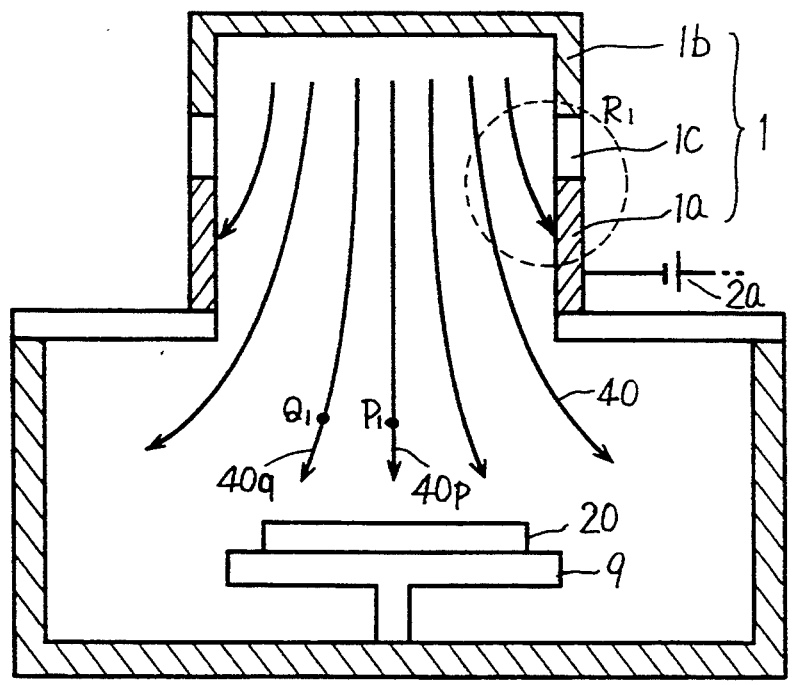
FIG. 2 is a schematic sectional view of the reaction chamber showing the interior of the reaction chamber when the plasma treatment apparatus is in operation.

Referring to FIG. 2, a magnetic line of force 40 which diverges from the upper portion of reaction chamber 1 to wafer 20 within reaction chamber 1 is formed by rendering conductive the electromagnetic coil. Electrons move along this magnetic line of force 40. However, if negative voltage is applied to first portion 1a by power supply 2a, movement of the electrons in the vicinity of first portion 1a will change.

Figure 3:
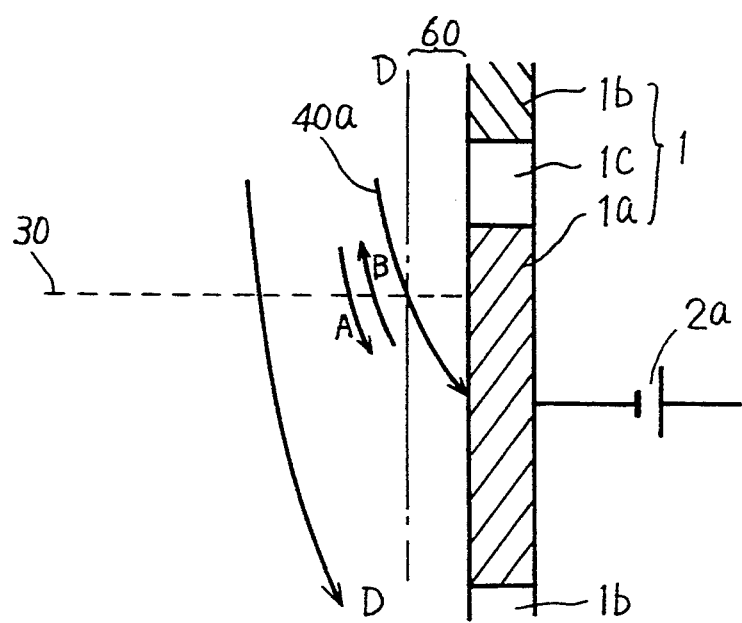
FIG. 3 is an enlarged view of $R_1$ in FIG. 2 showing the movement of electrons when a negative voltage is applied to the first portion.

Referring to FIG. 3, electrons possess negative charges. When negative voltage is applied to first portion 1a, the electrons which have moved along magnetic line of force 40a in the direction of arrow A receive an opposite force of magnetic line of force 40a in the direction of arrow B due to the potential of first portion 1a. Thus, the electrons do not reach the inner wall of reaction chamber 1, but rather stop in the vicinity of an end of ion sheath region 60 (a dash-dotted line D—D). Accordingly, the number of electrons near the inner wall of the reaction chamber 1 will be increased in ECR plane 30, so that the distribution of the electron density in ECR plane will be uniform as shown in FIG. 4.

Ions having positive charges are drawn to first portion 1a, since the negative voltage is applied to first portion 1a. However, the number of electrons increases in the vicinity of the end (a dash-dotted line D—D) of ion sheath region 60 which is along the inner wall of reaction chamber 1 as shown in the FIG. 3, and also the mobility of ions is small, so that ion decay will not increase. Accordingly, the ion density will not decrease in ion sheath region 60 in reaction chamber 1. This indicates that the negative potential applied to an electrode is cut off by the electrons.

If the electron density goes high in the vicinity of the end of ion sheath region 60 (a dash-dotted line D—D), these electrons receive the microwave energy in ECR plane 30 and generate plasma. The plasma density near the end of ion sheath region 60 arises, also the number of ions increases there, and thus the ion density can be made uniform. As a result, by applying negative voltage to first portion 1a, uniformity of the electron density is supposed to be improved without deteriorating the uniformity of the ion density at ECR plane.

Figure 4:
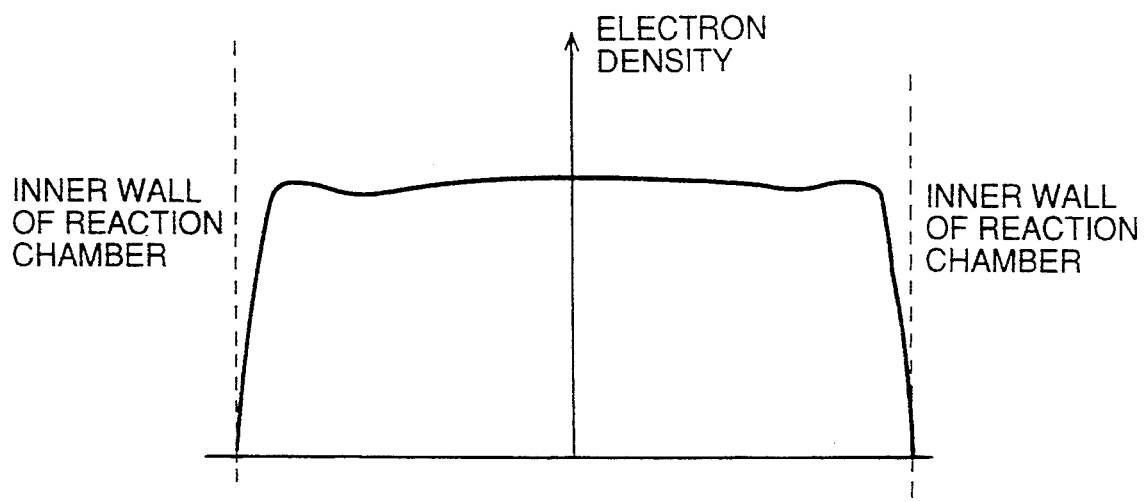
FIG. 4 shows a distribution of electron density in the ECR plane acquiring to the first embodiment of the present invention.
Figure 5A:
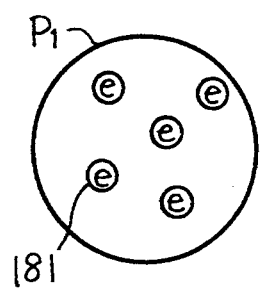
FIG. 5A is a schematic diagram showing electrons at $P_1$ of the FIG. 2.
Figure 5B:
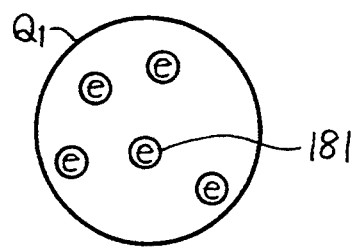
FIG. 5B is a schematic diagram showing electrons at $Q_1$ of the FIG. 2.

As shown in FIG. 4, when the distribution of the electron density in ECR plane is made uniform, the number of electrons which travel along the magnetic line of force becomes approximately equal in the center and at the periphery of reaction chamber 1. In other words, referring to FIG. 2, the number of electrons at $P_1$ of magnetic line of force 40p and the number of electrons at $Q_1$ of magnetic line of force 40q will be approximately equal as shown in FIGS. 5A and 5B.

Thus, when the number of electrons traveling along the magnetic line of force in the center becomes approximately equal to that at the periphery, the same number of electrons will be incident nearly uniformly on unit area on the surface of the wafer. Even if the film to be etched is not conductive, the surface of the wafer will be charged up uniformly.

Figure 6:
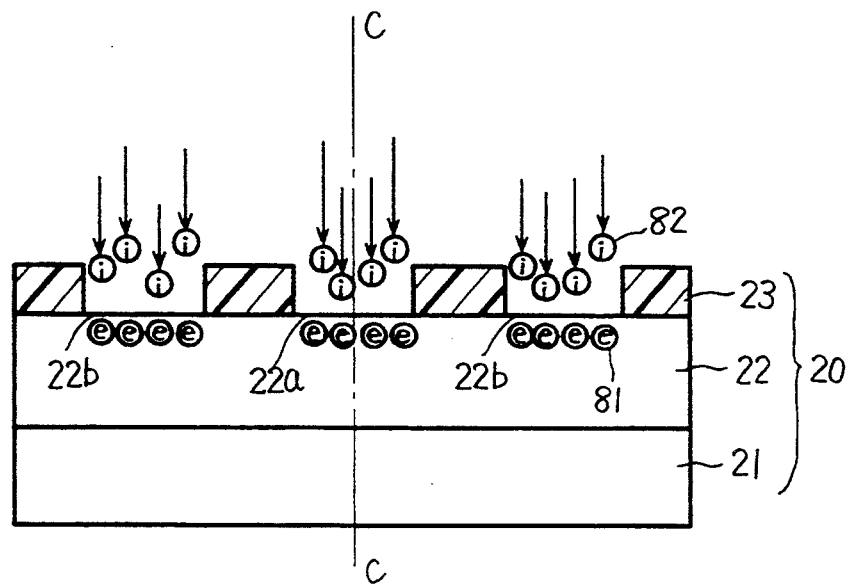
FIG. 6 is a schematic sectional view of a wafer showing the surface of the film to be etched being uniformly charged up.
Figure 7:
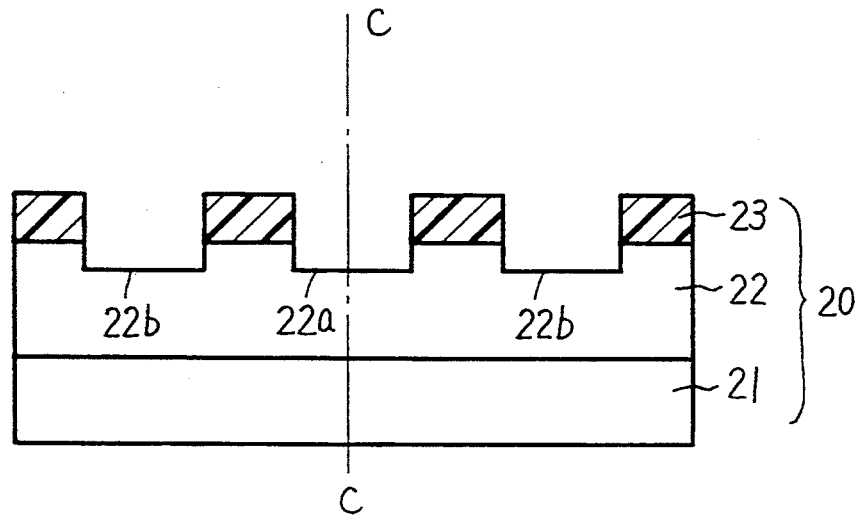
FIG. 7 is a schematic sectional view of the wafer showing etching of the film to be etched when the surface of the film to be etched is uniformly charged up.

Referring to FIG. 6, a wafer 20 includes a substrate 21, a film to be etched 22 which is formed on the surface of substrate 21, and a resist pattern 23. Resist pattern 23 is patterned to have a desired form, and etching is effected on film to be etched 22 using resist pattern 23 as a mask. During etching, the same number of electrons are incident on unit area on the surface of wafer 20. Thereby, respective exposed surfaces. 22a and 22b which are exposed from resist pattern 23 will be charged up approximately uniformly with electrons 81. When the wafer surface is thus charged up uniformly, approximately the same number of ions 82 are incident on exposed surfaces 22a and 22b respectively. Therefore, respective surfaces 22a and 22b are etched approximately uniformly as shown in FIG. 7. It is understood that the etching uniformity of the wafer is improved when the distribution of the electron density in the ECR plane is uniform.

Figure 8:
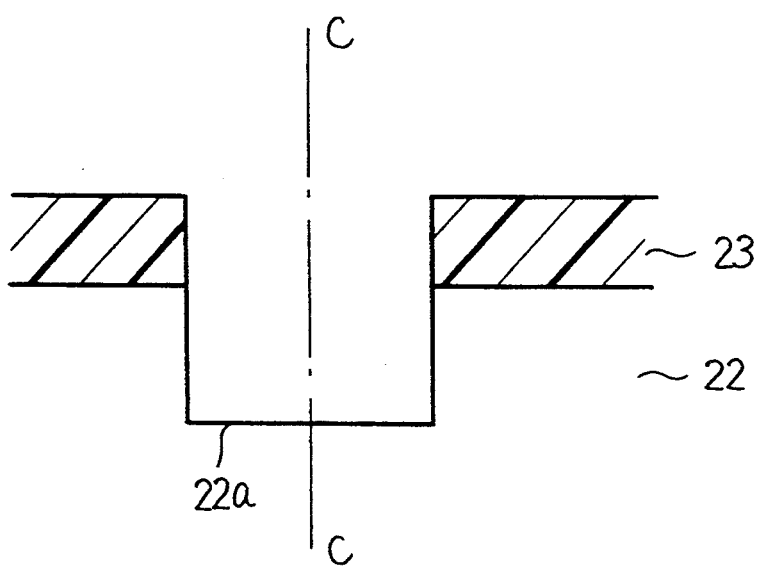
FIG. 8 is an enlarged sectional view schematically showing exposed surface 22a of FIG. 7 after etching.

On one exposed surface 22a, etching can be done with high uniformity as shown in FIG. 8, since exposed surface 22a is charged up uniformly.

Further, even if the conductive film, which is the film to be etched, is overetched, each exposed surface will be etched approximately uniformly as described above.

Because the distribution of the electron density in the ECR plane becomes uniform as shown in FIG. 4, so called drift unstability will be hard to occur. Accordingly, the random movement of ions due to the drift unstability is restrained, thus preventing the accompanying decrease of the etching anisotropy. It is understood that the improvement of the etching anisotropy can be achieved by rendering the distribution of the electron density uniform.

In a structure of the first embodiment of the present invention, negative voltage is applied to first portion 1a while second portion 1b is connected to the ground, thus providing the potential difference between portions 1a and 1b. However, the present invention is not limited to this structure, and the similar effect can be obtained by connecting first portion 1a to the ground and applying positive voltage to second portion 1b so that the potential difference is provided between portions 1a and 1b.

A structure of the plasma treatment apparatus according to a second embodiment of the present invention will be described.

Figure 9:
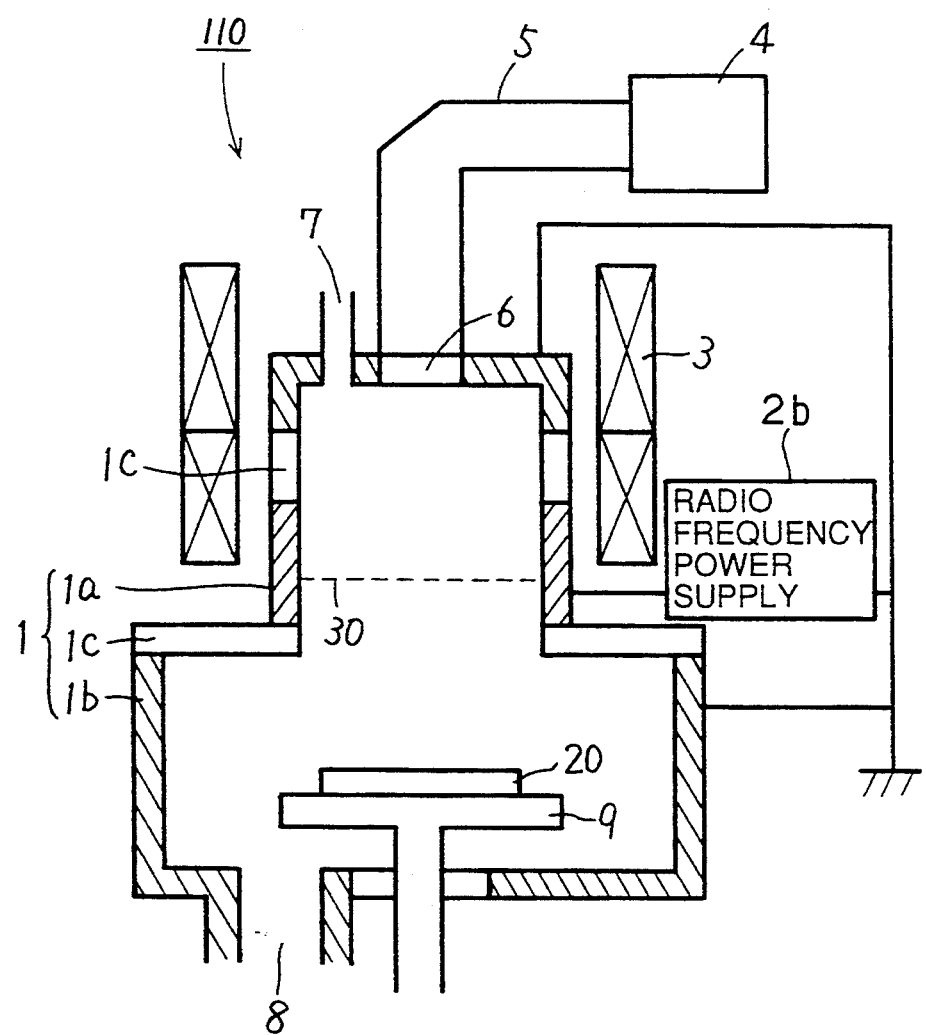
FIG. 9 is a sectional view schematically showing a structure of a plasma treatment apparatus according to a second embodiment of the present invention.

Referring to FIG. 9, a plasma treatment apparatus 110 according to the second embodiment of the present invention has an approximately the same structure as plasma treatment apparatus 10 in the first embodiment except power supply 2b which applies the potential difference between first portion 1a and second portion 1b. Radio frequency (RF) power supply is employed as power supply 2b. A voltage from the radio frequency power supply is applied to first portion 1a. The remaining second portion 1b is connected to the ground.

When the radio frequency potential, for example 13.56 MHz, is applied to first portion 1a by power supply 2b, negative voltage will be generated in a self-biasing manner in first portion 1a. This is the same situation where the negative voltage is applied to first portion 1a. It can thus be expected that approximately the same effect as is obtained in first plasma treatment apparatus 10 can be obtained in plasma treatment apparatus 110 of the second embodiment.

A plasma treatment apparatus according to a third embodiment of the present invention will be described.

Figure 10:
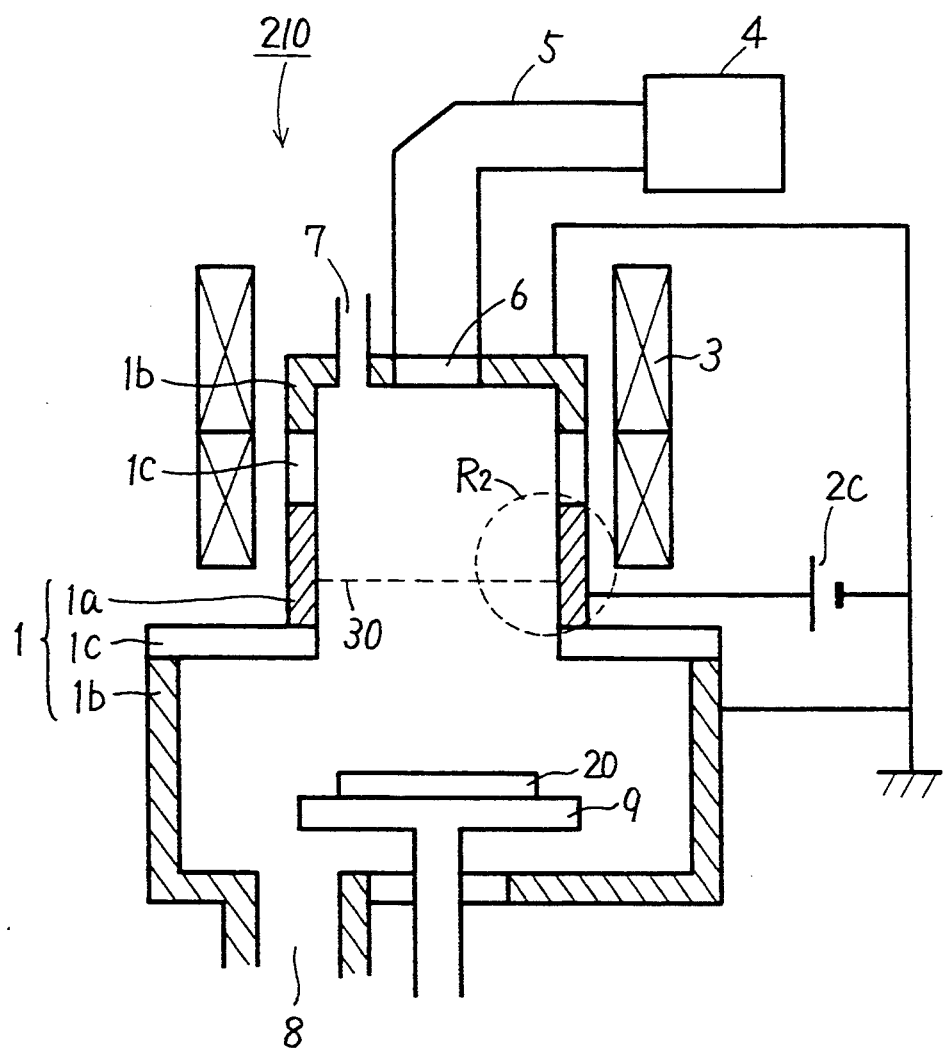
FIG. 10 is a sectional view schematically showing a structure of a plasma treatment apparatus according to a third embodiment of the present invention.

Referring to FIG. 10, a plasma treatment apparatus 210 in the third embodiment of the present invention has approximately the same structure as plasma treatment apparatus 10 in the first embodiment except power supply 2c which applies the potential difference between first portion 1a and second portion 1b. More particularly, in plasma treatment apparatus 210, positive potential is applied from power supply 2c to first portion 1a which is provided in the vicinity of ECR plane 30, while second portion 1b is connected to the ground.

An operation of the plasma treatment apparatus according to the third embodiment of the present invention will be described.

Referring to FIG. 10, the residual gas within reaction chamber 1 is exhausted sufficiently from exhaust hole 8. Then, the reactive gas is introduced into the reaction chamber 1 through pipe 7. While the reactive gas is introduced, a portion of the reactive gas is exhausted from exhaust hole 8, thus keeping the gas pressure within reaction chamber 1 at a predetermined value.

The microwave is then generated from microwave generating source 4. The microwave is introduced into reaction chamber 1 through the waveguide 5 and microwave introducing window 6. Meanwhile, electromagnetic coil 3 is made conductive. Thereby, a magnetic field which gradually attenuates from the upper portion of reaction chamber 1 to wafer 20 is formed. As the microwave and the magnetic field satisfy the condition of the cyclotron resonance, the reactive gas within reactive container 1 will generate the ECR discharge. Positive voltage, for example 10~100 V, is applied to first portion 1a by power supply 2c, thus providing the potential difference between first portion 1a and second portion 1b.

Figure 11A:
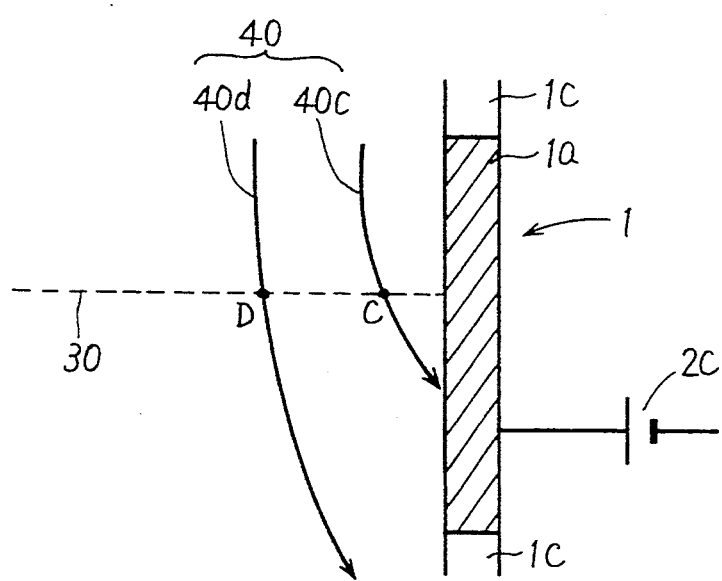
FIG. 11A is an enlarged view schematically showing $R_2$ of FIG. 10 when the plasma treatment apparatus according to the third embodiment of the present invention is in operation.
Figure 11B:
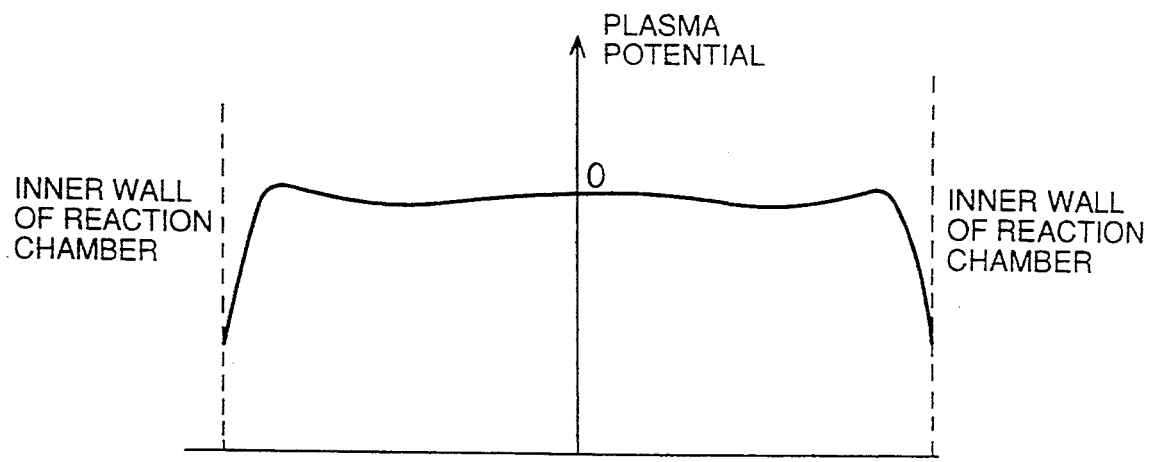
FIG. 11B shows the plasma potential in the ECR plane of the plasma treatment apparatus according to the third embodiment of the present invention.
Figure 12:
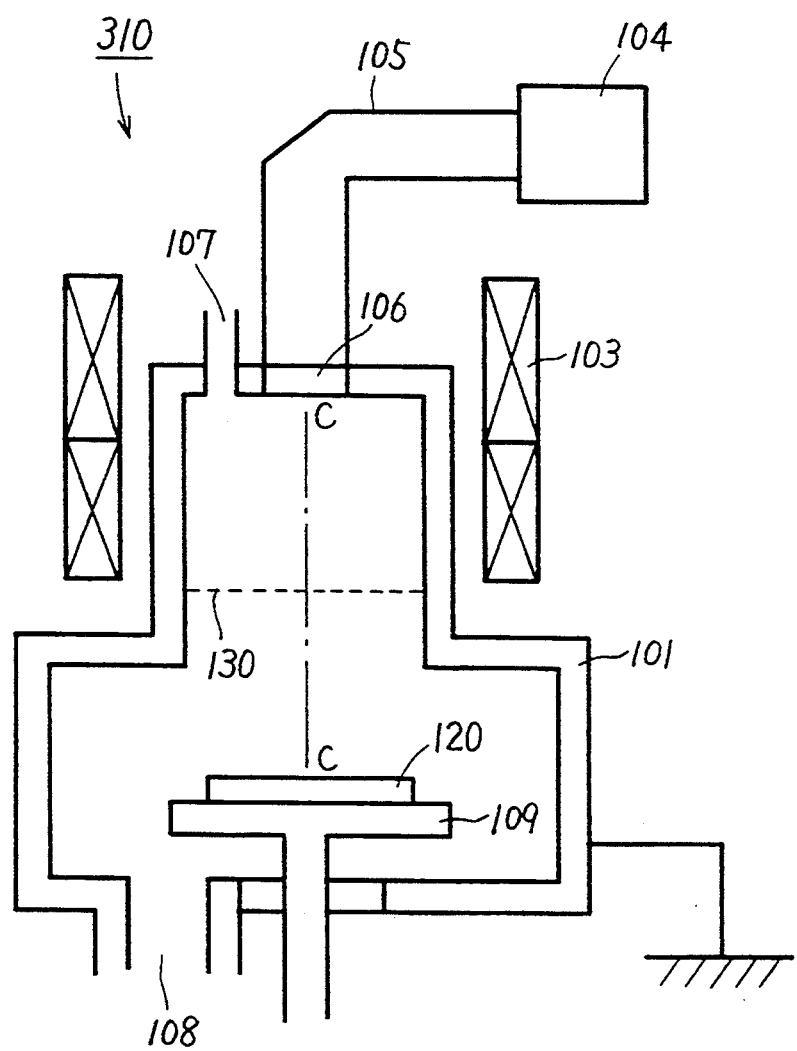
FIG. 12 is a sectional view schematically showing a structure of a conventional plasma treatment apparatus.
Figure 13:
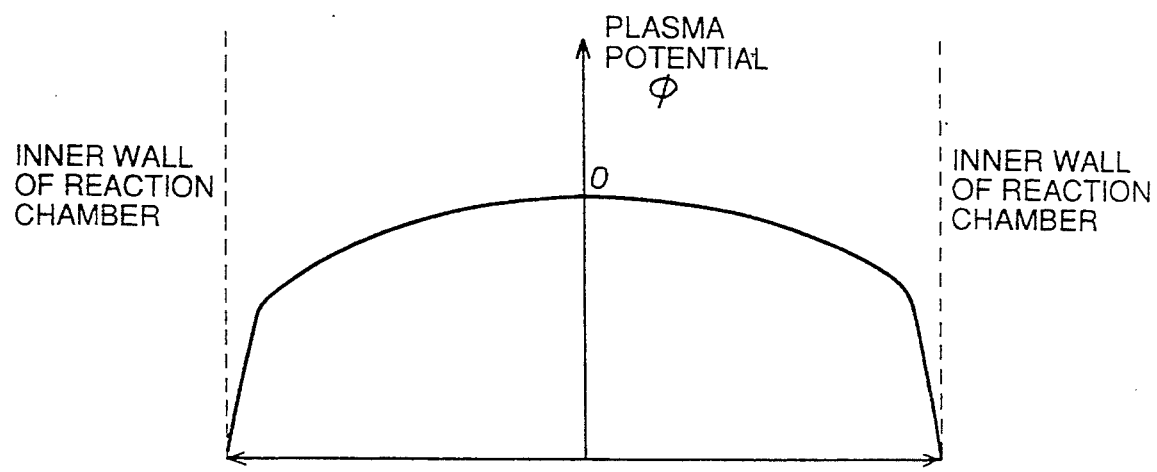
FIG. 13 shows the distribution of the plasma potential in the ECR plane of the conventional plasma treatment apparatus.
Figure 14:
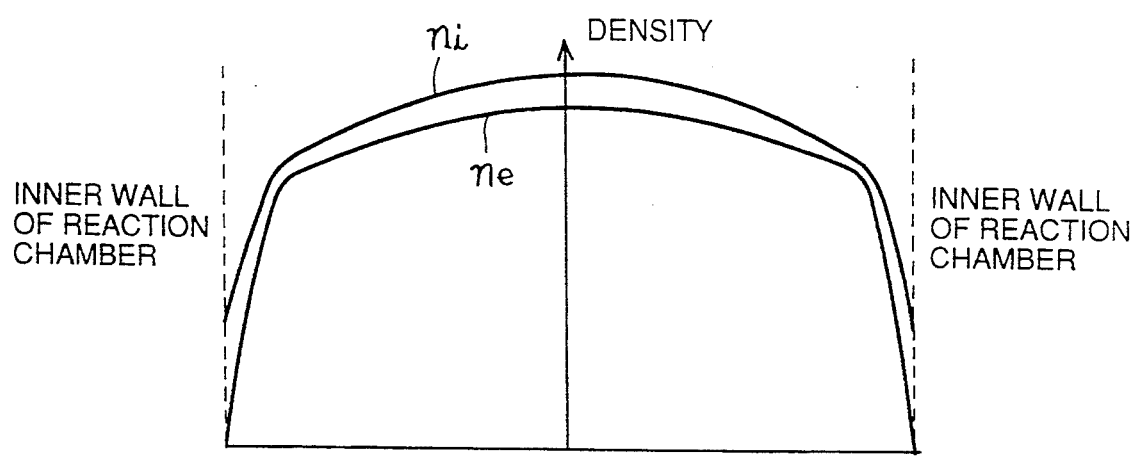
FIG. 14 shows the distributions of the electron density ($N_e$) and the ion density ($n_i$) in the ECR plane of the conventional plasma treatment apparatus.
Figure 15A:
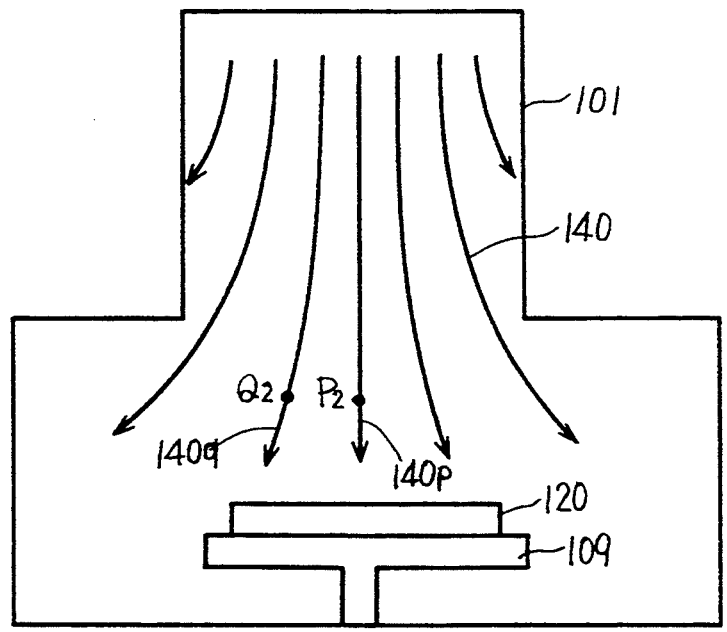
FIG. 15A schematically shows a magnetic line of force generated in the reaction chamber of the plasma treatment apparatus shown in FIG. 12.
Figure 15B:
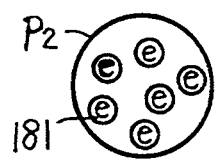
FIG. 15B schematically shows electrons at $P_2$ in FIG. 15A.
Figure 15C:
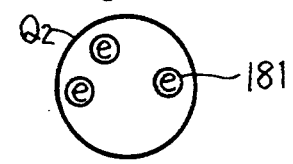
FIG. 15C schematically shows electrons at $Q_2$ in FIG. 15A.
Figure 16:
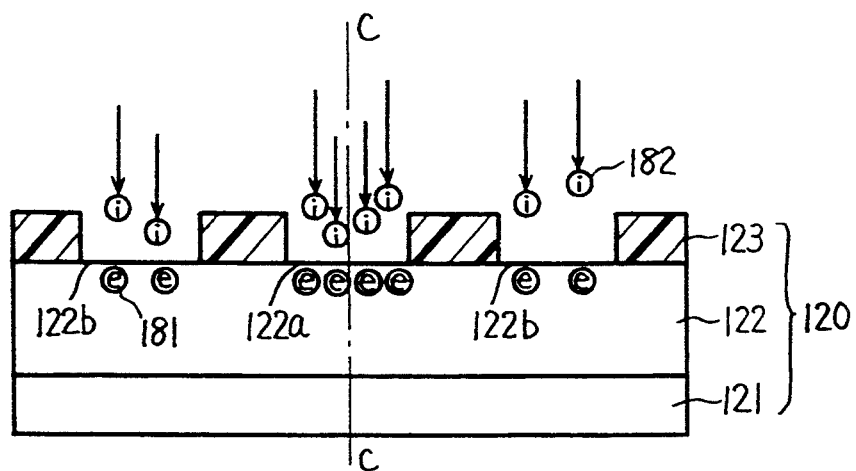
FIG. 16 is a schematic sectional view of the wafer showing the surface of the film to be etched being charged up not uniformly.
Figure 17:
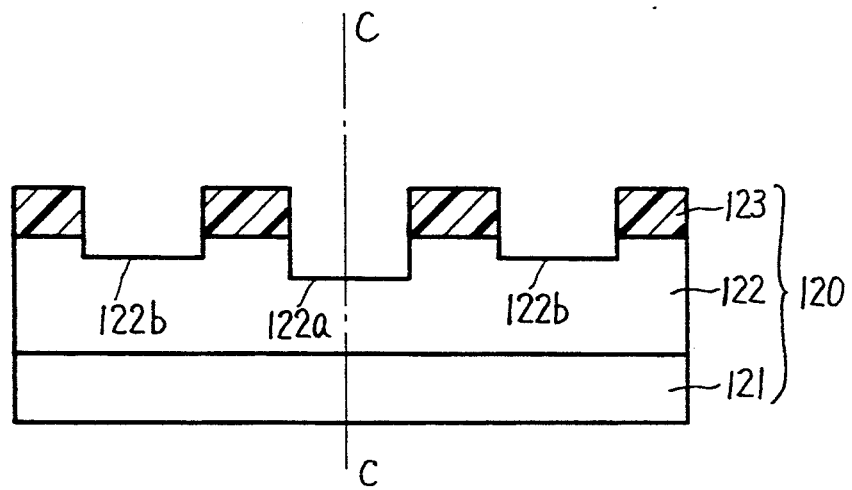
FIG. 17 is a schematic sectional view of the wafer showing etching of the film to be etched when the film to be etched is charged up not uniformly.
Figure 18:
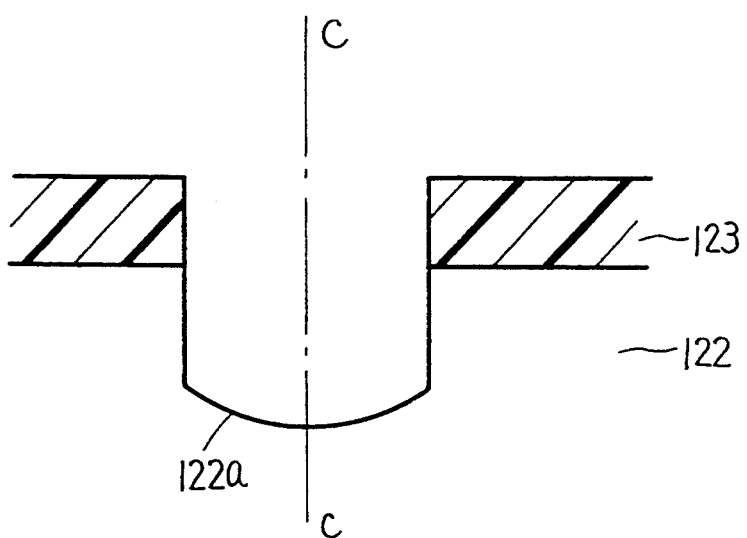
FIG. 18 is an enlarged sectional view schematically showing the shape of exposed surface 122a in FIG. 17 after etching.
Figure 19:
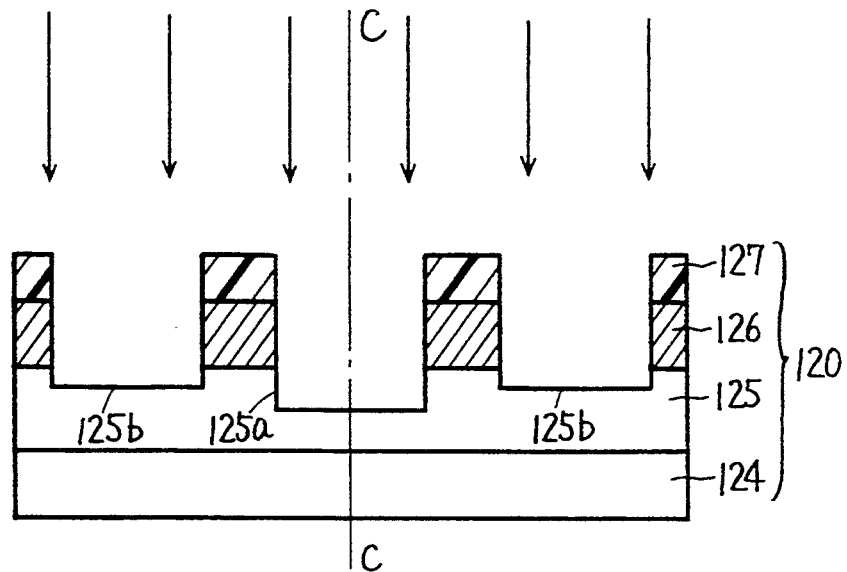
FIG. 19 is a sectional view schematically of the wafer showing non-uniformity of etching caused when the film to be etched is conductive.
Figure 20:
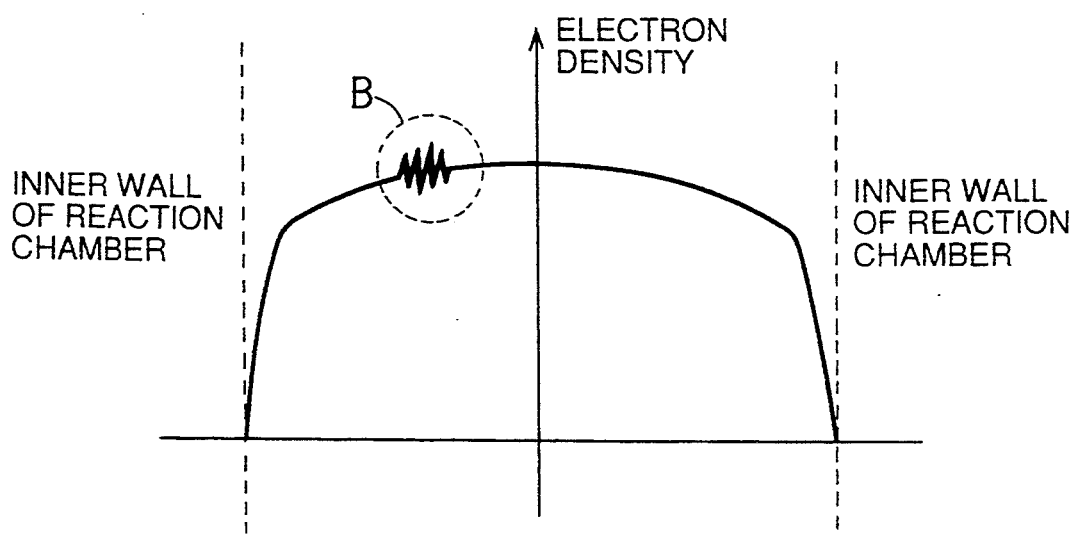
FIG. 20 shows drift unstability caused when the distribution of the electron density becomes non-uniform in the conventional plasma treatment apparatus.
Figure 21:
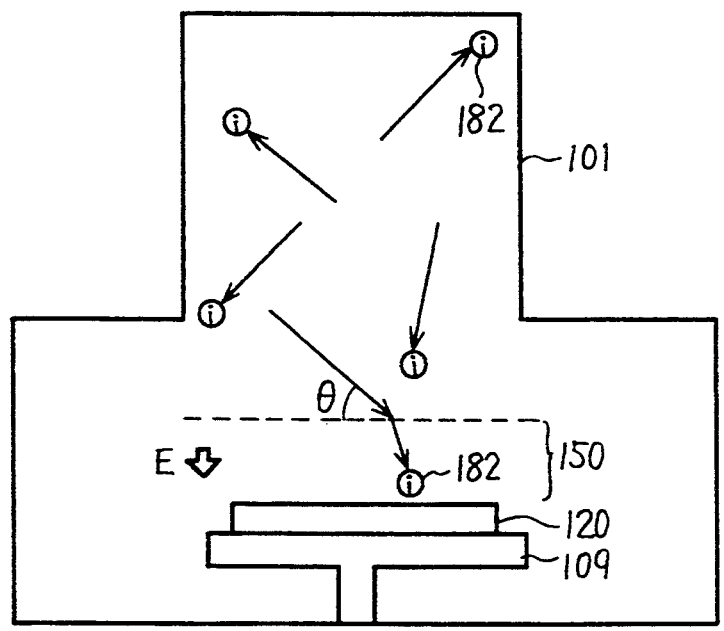
FIG. 21 shows behavior of ions in the reaction chamber when the drift unstability occurs.
Figure 22:
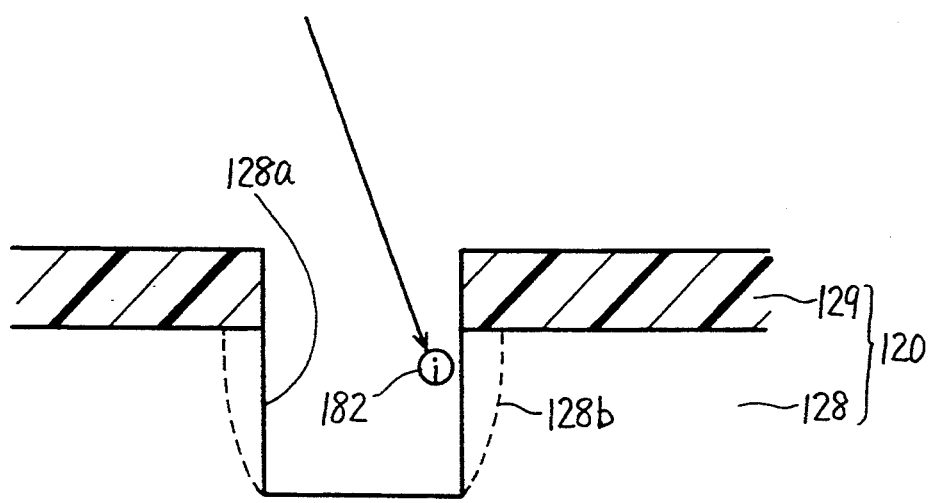
FIG. 22 is an enlarged partial sectional view of the wafer schematically showing ions being incident on the wafer.
Figure 23A:
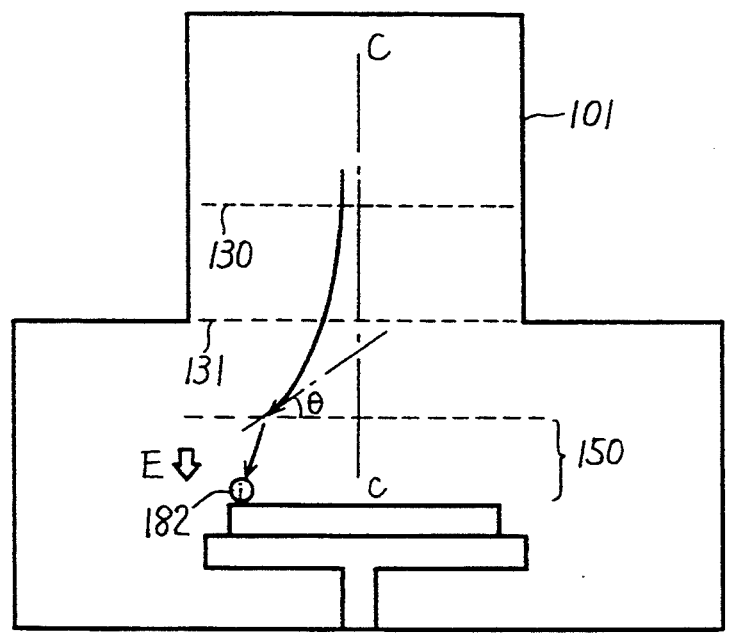
FIG. 23A is a schematic sectional view of the reaction chamber showing that anisotropy of etching is decreased when the distribution of the plasma potential is non-uniform.
Figure 23B:
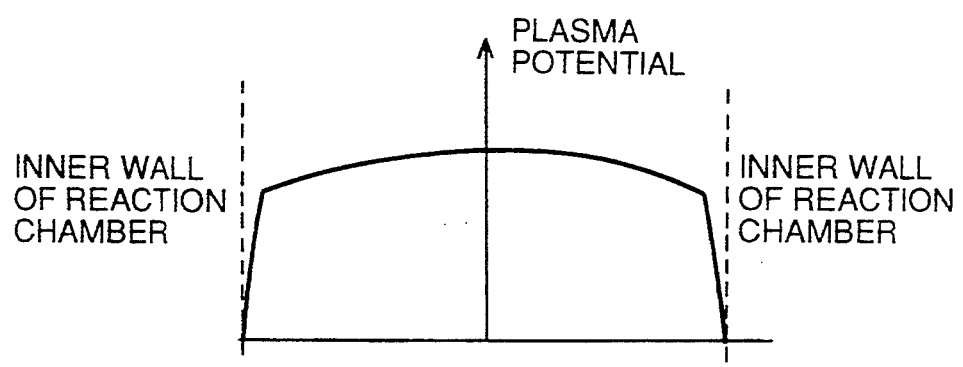
FIG. 23B shows the distribution of the plasma potential in the surface shown by a dotted-line 131 in FIG. 23A.

Referring to FIG. 11A, electrons in the plasma move along magnetic line of force 40 which is formed by the electromagnetic coil (not shown). The electrons having negative charge and traveling along magnetic line of force 40c will be pulled in first portion 1a because the positive voltage is applied to first portion 1a by the supply source 2c. Thus, more electrons move at portion C in ECR plane 30 than at portion D along the magnetic line of force 40c to first portion 1a. Accordingly, relatively large negative charge is lost in ECR plane 30 at the periphery (i.e. near portion C) of reaction chamber 1. Thus, the plasma potential in ECR plane 30 at the periphery of reaction chamber 1 is raised, and thus the plasma potential in ECR plane 30 is made uniform, such that the electric field in the radial direction of reaction chamber 1 is decreased.

By applying positive voltage to first portion 1a, it becomes possible to make uniform the plasma potential in the radial direction of reaction chamber 1 as well as ECR plane 30. Ions are thus prevented from moving from the center to the periphery of reaction chamber 1 as they travel from the upper portion of reaction chamber 1 to wafer 20 due to non-uniformity of the electric field. As a result, an approach angle of ions when they proceed into the ion sheath region becomes relatively large, and thus the anisotropy could be improved.

However, when the positive voltage is applied to the first portion 1a, the electron density at the periphery of reaction chamber 1 is supposed to be decreased. Accordingly, the distribution of the electron density in the radial direction of reaction chamber 1 becomes further non-uniform, the drift unstability might be increased, and the accompanying anisotropy of etching is decreased. Whether the etching anisotropy can be improved or not may depend on the coordination of the magnetic field, the shape of reaction chamber 1 and the like.

In plasma treatment apparatus 210 according to the third embodiment of the present invention, positive voltage is applied to first portion 1a and the ground potential is applied to second portion 1b, thus providing the potential difference between portion 1a and portion 1b. Also, when the ground potential is applied to first portion 1a and the negative voltage is applied to second portion 1b, the potential difference can be provided between first portion 1a and second portion 1b as above. It is understood that approximately the same effect as described above can be obtained.

As described above, the plasma treatment apparatus according to the first, the second and the third embodiments of the present invention have such structure that the potential difference is provided between first portion 1a and second portion 1b by applying the positive, negative or radio frequency (RF) voltage to first portion 1a, thus enabling the control of the uniformity and anisotropy of etching.

In plasma treatment apparatus 10, 110, and 210 according to the first, the second and the third embodiments of the present invention, first portion 1a and second portion 1b are provided so as to apply different potentials to each portion. The plasma treatment apparatus of the present invention, however, is not limited to the structure, but rather it may be structured such that multiple, at least three, portions which are insulated from each other are provided to apply different voltages to respective portions. The above structure may include a plurality of power supplies.

The plasma treatment apparatus performing etching by the plasma has been described in the embodiments. However, the present invention is not limited to those and could be applied to any plasma treatment apparatus which can process the surface of the semiconductor substrate, e.g. forming a thin film utilizing ECR discharge.

In the plasma treatment apparatus according to the present invention, different potentials are applied to the first and the second peripheral wall portions respectively by the power supply. By providing the potential difference to the first and the second peripheral wall portions, the movement of electrons as well as ions in the vicinity of the first and the second peripheral wall portions within the reaction chamber can be controlled. Therefore, etching can be achieved uniformly and in a highly anisotropic manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma treatment apparatus for performing a predetermined treatment at a main surface of a substrate by generating plasma by way of electron cyclotron resonance discharge above the main surface of said substrate placed within a reaction chamber, and having a peripheral wall portion surrounding said plasma, wherein said peripheral wall portion includes first electric field applying means arranged to apply a first voltage and surrounding an outer peripheral portion of a first space for applying an electric field only at the outer peripheral portion of said first space, second electric field applying means electrically insulated from said first electric field applying means, arranged to apply a second voltage different from said first voltage, and surrounding an outer peripheral portion of a second space different from said first space for applying an electric field only at the outer peripheral portion of said second space, and power supply means for applying said first and second voltages to said first and second electric field applying means.

2. The plasma treatment apparatus according to claim 1, wherein said power supply means includes a DC source which is disposed such that said first voltage is a negative voltage and said second voltage is connected to the ground.

3. The plasma treatment apparatus according to claim 1, wherein said power supply means includes a DC source which is disposed such that said first voltage is a positive voltage and said second voltage is connected to the ground.

4. The plasma treatment apparatus according to claim 2, wherein said negative voltage is not less than −100 V and not more than −10 V.

5. The plasma treatment apparatus according to claim 3, wherein said positive voltage is not less than 10 V and not more than 100 V.

6. The plasma treatment apparatus according to claim 1, wherein said power supply means includes an AC source which is disposed such that said first voltage is a radio frequency voltage and said second voltage is connected to the ground.

7. The plasma treatment apparatus according to claim 5, wherein said radio frequency voltage is 13.56 MHz.

8. A plasma treatment apparatus according to claim 1, characterized by the absence of any electrode in the plasma generating space surrounded by the first and second peripheral wall portions.

9. A plasma treatment apparatus for performing a predetermined treatment at a main surface of a substrate by generating plasma by way of the electron cyclotron resonance discharge above the main surface of said substrate, comprising:

a base for placing said substrate;

a reaction chamber which includes a peripheral wall portion surrounding said plasma and accommodates said base;

magnetic field generating means disposed outside said peripheral wall portion for generating a magnetic field within said reaction chamber;

microwave introducing means for introducing the microwave into said reaction chamber; wherein said peripheral wall portion includes first electric field applying means arranged to apply a first voltage and surrounding an outer peripheral portion of a first space for applying an electric field only at the outer peripheral portion of said first space, second electric field applying means electrically insulated from said first electric field applying means, arranged to apply a second voltage different from said first voltage, and surrounding an outer peripheral portion of a second space different from said first space for applying an electric field only at the outer peripheral portion of said second space, and power supply means for applying said first and second voltages to said first and second electric field applying means.

10. A plasma treatment apparatus according to claim 9, characterized by the absence of any electrode in the plasma generating space surrounded by the first and second peripheral wall portions.

* * * * *